(12) United States Patent
de Ridder et al.

(10) Patent No.: US 10,224,222 B2
(45) Date of Patent: Mar. 5, 2019

(54) ASSEMBLY OF LINER AND FLANGE FOR VERTICAL FURNACE AS WELL AS A VERTICAL PROCESS FURNACE

(71) Applicant: ASM IP Holding B.V., Almere (NL)

(72) Inventors: Chris G. M. de Ridder, Almere (NL); Theodorus G. M. Oosterlaken, Almere (NL); Klaas P. Boonstra, Almere (NL)

(73) Assignee: ASM IP HOLDING B.V., Almere (NL)

( * ) Notice: Subject to any disclaimer, the term of this patent is extended or adjusted under 35 U.S.C. 154(b) by 637 days.

(21) Appl. No.: 14/481,131

(22) Filed: Sep. 9, 2014

(65) Prior Publication Data

US 2016/0071750 A1 Mar. 10, 2016

(51) Int. Cl.
*H01L 21/67* (2006.01)
*H01L 21/683* (2006.01)
*H01L 21/673* (2006.01)

(52) U.S. Cl.
CPC .. *H01L 21/67109* (2013.01); *H01L 21/67017* (2013.01)

(58) Field of Classification Search
CPC ........ F27D 7/06; F27D 99/0075; F27B 14/04; F27B 14/061; F27B 17/0025
USPC ....................................................... 432/258
See application file for complete search history.

(56) References Cited

U.S. PATENT DOCUMENTS

| | | | | |
|---|---|---|---|---|
| 5,364,488 A | * | 11/1994 | Minato | H01J 37/32522 118/723 ER |
| 5,578,132 A | * | 11/1996 | Yamaga | C23C 16/4404 118/715 |
| 5,846,073 A | * | 12/1998 | Weaver | C30B 31/10 432/206 |
| 6,187,102 B1 | * | 2/2001 | Yamamoto | C23C 16/4401 118/725 |
| 6,246,029 B1 | * | 6/2001 | Addis | C30B 11/003 134/1 |
| 7,731,494 B2 | * | 6/2010 | Klinger | H01L 21/67126 432/242 |
| 2003/0175650 A1 | * | 9/2003 | Ridder | H01L 21/67098 432/242 |
| 2006/0150904 A1 | * | 7/2006 | Ozaki | C23C 16/4401 118/715 |
| 2007/0181066 A1 | | 8/2007 | Cadwell et al. | |

(Continued)

*Primary Examiner* — Steven B McAllister
*Assistant Examiner* — Steven S Anderson, II
(74) *Attorney, Agent, or Firm* — Preti, Flaherty, Beliveau & Pachios LLP

(57) ABSTRACT

An assembly of a liner and a support flange for a vertical furnace for processing wafers, wherein the support flange is configured for supporting the liner, at least two support members that are connected to the cylindrical wall, each having a downwardly directed supporting surface, wherein each downwardly directed supporting surface is positioned radially outwardly from the inner cylindrical surface, wherein the support flange and/or the liner are configured such that, when the liner is placed on the support flange, the downwardly directed supporting surfaces are in contact with an upper surface of the support flange and support the liner, and wherein at least the part of the lower end surface of the liner that bounds the inner cylindrical surface is spaced apart from the upper surface of the support flange.

17 Claims, 6 Drawing Sheets

(56) References Cited

U.S. PATENT DOCUMENTS

| | | | |
|---|---|---|---|
| 2010/0051597 A1* | 3/2010 | Morita | H01L 21/67109 |
| | | | 219/201 |
| 2012/0186573 A1* | 7/2012 | Jdira | H01L 21/67109 |
| | | | 126/58 |
| 2014/0072925 A1* | 3/2014 | Kaneko | F27B 17/0025 |
| | | | 432/200 |

* cited by examiner

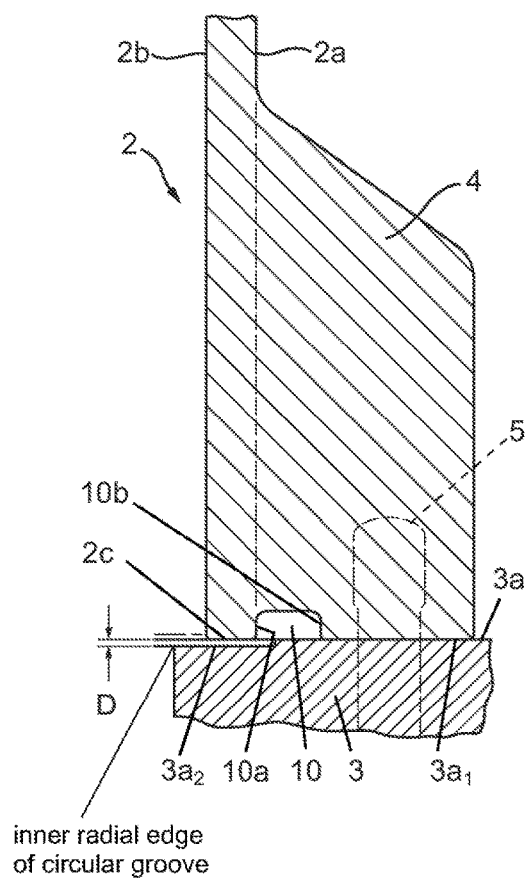
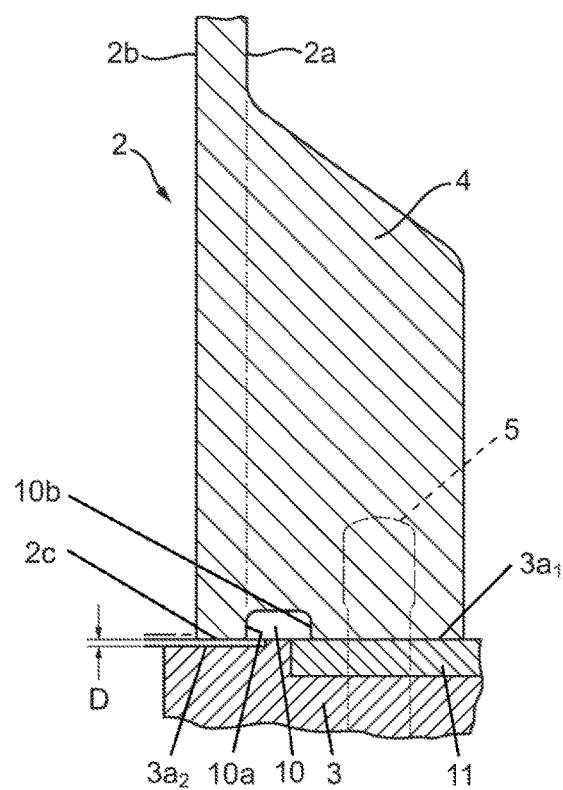

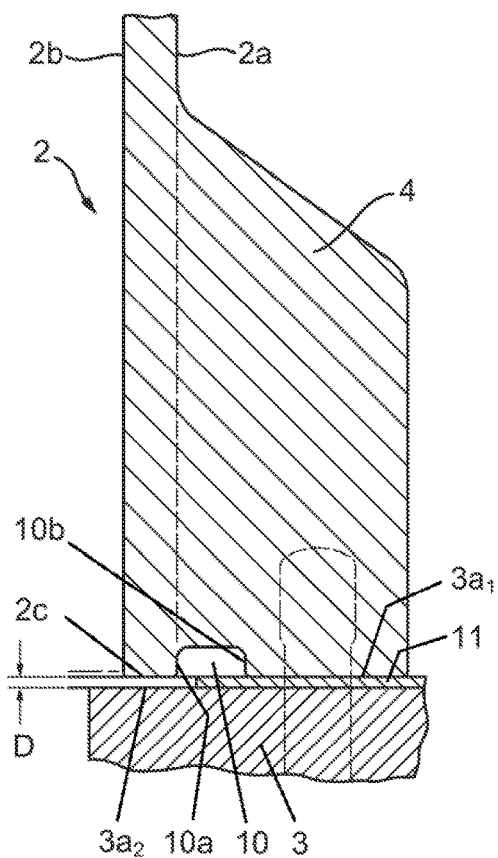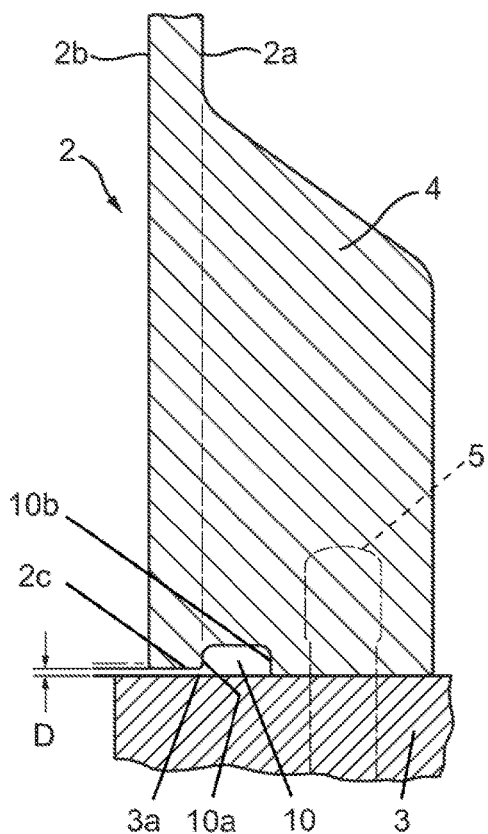

ASSEMBLY OF LINER AND FLANGE FOR VERTICAL FURNACE AS WELL AS A VERTICAL PROCESS FURNACE

FIELD

The present invention relates to a vertical furnace and more in particular to an assembly of a liner and a support flange in a vertical furnace.

BACKGROUND

A conventional vertical processing furnace for processing semiconductor wafers may include a heating means, placed around a bell jar-shaped process tube and a cylindrical inner tube or liner that is coaxially disposed within the process tube. The upper end of the process tube may be closed, typically by a dome-shaped structure, whereas the lower end surface of the process tube is supported by a support flange. The liner may be open at both its upper and its lower end, with the lower end supported by the support flange as well. An inner space bounded by the liner and the support flange forms a process chamber in which wafers to be treated may be processed. Between the liner and the process tube is a circumferential space. The support flange is provided with an inlet opening for inserting a wafer boat carrying wafers. The wafer boat may be placed on a door that is vertically moveably arranged and that is configured to close off the inlet opening in the flange. Optionally, the wafer boat may be placed on a pedestal which in turn is placed on the top side of the door. The flange may further include at least one gas inlet opening that is in fluidum connection with the process chamber bounded by the liner. Additionally, the flange may include a gas exhaust that is in fluidum connection with the circumferential space. This gas exhaust may be connected to a vacuum pump for pumping off gas from the circumferential space.

A well-known problem of the conventional vertical processing furnace for processing semiconductor wafers consists of small particles contaminating the process chamber (and the semiconductor wafers placed within). This problem has been identified in various prior art, such as for example US 2012/0186573, US 2002/602c4505 and US 2007/0181066 in which various causes of contamination are discussed and associated solutions are disclosed.

SUMMARY

However, applicant has established that another source of contamination of the process chamber by particles exists, which is not identified (nor solved) in the prior art. This particle source is formed by the contact between the liner and the support flange. More specifically, at the position where a lower end surface of the liner is in contact with the support flange. During the processing of wafers, the liner and the support flange are subjected to a heat flow that increases the temperature of both liner and support flange. Due to the temperature increase, liner and support flange experience thermal expansion, which causes them to radially expand. As the liner and the support flange have different coefficients of thermal expansion, the liner and the support flange move with respect to each other during expansion. This causes friction between the lower end surface of the liner and the upper surface of the support flange, resulting in small particles breaking away from liner and/or support flange. The particles migrate into the process chamber, thus contaminating the process chamber and the wafers which are being processed.

The object of the invention is to provide an improved assembly of a liner and a support flange that retains the advantages of the prior art, while reducing the disadvantages.

To that end, the invention provides an assembly of a liner and a support flange for a vertical furnace for processing wafers, wherein the support flange is configured for supporting the liner and includes:

a central inlet opening for inserting and removing a boat that is configured to carry wafers;

the liner of the assembly including:

a cylindrical wall defining an inner cylindrical surface, an outer cylindrical surface and a lower end surface that delimits a liner inlet opening for inserting and removing a boat that is configured to carry wafers;

a gas outlet opening adjacent an upper end of the liner;

at least two support members that are connected to the cylindrical wall, each having a downwardly directed supporting surface, wherein each downwardly directed supporting surface is positioned radially outwardly from the inner cylindrical surface;

wherein the support flange and/or the liner are configured such that, when the liner is placed on the support flange, the downwardly directed supporting surfaces are in contact with an upper surface of the support flange and support the liner, and wherein at least the part of the lower end surface of the liner that bounds the inner cylindrical surface is vertically spaced apart from the upper surface of the support flange.

The assembly of the invention provides several advantages over the prior art. First of all, the liner and the support flange are not in direct contact with each other near the inner cylindrical surface of the wall, which prevents creation of particles due to friction on that location. Instead, the liner is supported only by support members, which are in contact with the support flange on the radial outside of the liner. As such, any particles created by friction between the support members and the support flange can not directly enter the process chamber enclosed by the cylindrical wall of the liner and the support flange. Such introduction is only possible if the particles would radially inwardly traverse the slit underneath the lower end surface of the liner in a radially inward direction. It is highly unlikely that such a radial inward migration would occur because there is a pressure difference between the process chamber within the liner and the space radially outside of the liner. In fact, the pressure in the process chamber is higher than the pressure in the space radially outside of the liner because, generally, gas is supplied into the process chamber and gas is evacuated from the space radially outside of the process chamber. Consequently, when a particle will be released due to contact between the support member and the support flange, this particle will be immediately sucked to the gas exhaust opening present in the flange in the area radially outside of the liner. Placing the support members radially outside the inner cylindrical surface of the liner wall therefore reduces the possibility of particles entering the process chamber enclosed by the cylindrical wall of the liner and the support flange. In addition, the spatial separation of at least part of the lower end surface of the liner wall and the flange reduces the wear on the liner, thus increasing its lifetime. As such, the use of the support members is economically attractive.

In an embodiment of the invention, the lower end surface of the cylindrical wall is axially spaced from the downwardly directed supporting surfaces of the at least two support members, wherein the supporting surfaces of the support members are positioned at a lower level than the lower end surface of the cylindrical wall. Thus a slit is created between the lower end surface of the liner and the upper surface of the support flange when the liner is placed on the support flange.

This is advantageous, as the lower end surface of the liner is elevated over the flange by the support members over its entire circumference. As a result, the contact area between the liner and the support flange is limited to the supporting surfaces of the support members. In addition, the upper surface of the support flange does not need to be adapted in order to provide the spatial separation of the liner and the support flange. As a consequence, an existing vertical furnace could be adapted according to the invention by introducing a liner with support members on the existing support flange. This provides a cost-effective way to introduce the invention in vertical furnaces, even in existing ones.

An embodiment of the invention could also comprise the support flange that includes a first, substantially horizontal surface part that is opposite the at least two support members and a second, substantially horizontal surface part that extends at least opposite the lower end surface of the cylindrical wall, wherein the second surface part is at a lower level than the first surface part.

In a further elaboration of this embodiment, the second horizontal part may be a substantially circular groove in the upper surface of the flange that forms the first surface part, wherein the circular groove has a center that coincides with a central vertical axis of the liner and wherein an inner radial edge of the groove has a diameter that is smaller than the inner diameter of the liner and wherein an outer radial edge of the groove has a diameter that is larger than the outer diameter of the liner.

The lower end surface of the liner and the upper surface of the flange are separated by a slit formed between the lower end surface of the liner and the second surface part of the flange that may be embodied as the bottom of the circular groove which is provided in the upper surface of the flange. The slit allows a flow of reaction gas from the process chamber inside the liner towards the space radially outside of the cylindrical wall, thus forcing particles created by friction radially away from the process chamber inside the liner.

In an embodiment of the invention, the support flange may include at least one support pad located opposite the at least two support members, wherein the at least one support pad is configured to reduce friction between the support flange and the supporting surface of the support members associated with the pad.

Using support pads allows the introduction of contact materials that have improved properties with regard to sliding. This way the friction between the flange and the supporting surface of the support members can be reduced. A reduction of the friction may reduce the creation of particles. In addition, the material can contain properties to prevent the creation of particles.

In an embodiment, the at least one support pad may be at least partially embedded in the support flange.

In a combination of the embodiment wherein the flange has a first surface part and a second surface part at different levels, as specified before, the first surface part may be formed by an upper surface of the at least one support pad. The second surface part may be formed by the remaining upper surface of the support flange. In other words, the upper surface of the at least one support pad may be at a slightly higher lever than the level of the remaining upper surface of the support flange.

In an elaboration of the invention the flange comprises a substantially flat upper surface to which the support pads are connected, wherein the upper surface of the pads forms the second surface part.

In such an embodiment, the support pads in combination with the support members provide the spatial separation of the lower end surface of the cylindrical liner wall and the upper surface of the flange where that upper surface is not covered with the support pads. This requires only minimal changes to the support flange and nevertheless provides the advantages of the previous embodiments.

In an embodiment of the invention the at least one support pad is made of a material with a relatively low constant of friction, for example Teflon, Polyimide, PEEK, Hastelloy or any other suitable material.

In an further embodiment of the invention the at least one support pad may be made of a metal having a coating with a relatively low constant of friction, wherein the coating is chosen from the group including Teflon, Polyimide, PEEK, other polymeric coatings, and a coating of diamond-like carbon.

Such low friction materials or low friction coatings alleviate the formation of particles due to friction.

According to an embodiment of the invention, each support member has a tangential length and comprises at its downwardly directed surface a recess extending tangentially along the entire tangential length of the support member, the recess defining a radially inward recess edge and a radially outward recess edge and having a downwardly directed side that is open, the radially outward recess edge being positioned radially inwardly relative to the supporting surface and the radially inward recess edge is positioned radially outwardly relative to the cylindrical wall. Any particles that are released due to contact between the supporting surface and the supporting flange are created radially outwardly from the outer surface of the cylindrical wall of the liner. The particles are forced to migrate radially away from the outer surface of the cylindrical liner wall by a flow of reaction gas from the inner side of the cylindrical liner wall to the outside of the cylindrical liner wall via the split between the lower end surface of the liner wall and the upper surface of the support flange. In the end, the particles may be removed from the vertical furnace, for example via the gas exhaust. In an embodiment, each support member may be embodied as a protrusion that is connected to the outer cylindrical surface of the cylindrical wall of the liner, wherein the downwardly directed supporting surface formed by a downwardly directed surface of the protrusion is positioned radially outwardly from the outer cylindrical surface of the cylindrical wall of the liner.

The cylindrical wall of the liner as well as the protrusions may be manufactured from quartz and may be connected to each other by a weld. Such a construction is relatively simple to manufacture and additionally very robust, which is of importance because of the fact that the liner must remain intact, during the normal use of the vertical furnace and during maintenance operations.

According to an aspect of the invention, the support members have two opposing tangential end surfaces, which extend radially outwardly from the outer cylindrical surface of the liner wall, wherein the support flange is provided with a plurality of positioning projections, that extend upwards from the upper surface of the support flange, wherein the positioning projections and the outer cylindrical surface of the liner are spatially separated, and wherein the positioning projections are parallel to a tangential end surface of a support member and engage each said tangential end surface of said support member, so that the liner is centered between the positioning projections and is allowed to radially expand.

Because the positioning projections engage with the support members on the tangential end surfaces, radial expansion and shrinkage of the liner is possible, i.e. not hindered by the positioning projections. The positioning projects ensure that the liner remains centered on the support flange but allow expansion and shrinkage of the liner, for example due to temperature fluctuations. Although friction on the contact surface between the support members and the positioning projections might create particles, the particles are created outside the process chamber enclosed by the cylindrical wall of the liner and the upper surface of the support flange. In addition, the positioning projections and the support members are engaged over a relatively small surface. As a result, due to the relatively small surface on which friction may occur, a very limited number of particles will be created. Also, the positioning projections may comprise a material that that reduces friction or is provided with improved properties with regard to thermal processes.

According to an embodiment of the invention, the liner may comprise three support members, evenly spaced along the circumference of the cylindrical outer surface of the liner wall.

The advantage of this embodiment is that it is more stable than configurations comprising more than three support members. In addition, a configuration with three support members that are equally spaced remains stable even under the influence of thermal expansion, whereas other configurations may lead to wobbling of the liner when subject to thermal expansion. Having three support members is therefore advantageous with respect to the centering and the support of the liner.

In an embodiment, each supporting member may have a tangential length that is in the range of 1-5 cm. Such a tangential dimension provides sufficient support surface and robustness and simultaneously prevents that the support members may disturb or hinder the radial outflow in the split between the lower end surface of the cylindrical wall of the liner and the support flange.

In an embodiment, the support flange may include at least one gas exhaust that opens in the upper surface of the support flange in an area that is positioned radially outside the outer cylindrical surface of the liner wall. The gas exhaust may be connected to a pump that evacuates process gas from the space that is bounded by the outer surface of the liner wall and an inner surface of the process tube of a vertical process furnace in which the assembly is used.

The invention also comprises a vertical process furnace which includes:
- a process tube defining an interior process tube space;
- heating means configured to heat the interior process tube space;
- a vertically movably arranged door configured to close off the central inlet opening in the support flange and configured to support a wafer boat that is configured to hold semiconductor wafers; and
- an assembly according to the invention, wherein the support flange is connected to a bottom side of the process tube and wherein the liner extends in the interior process tube space.

The vertical furnace according to the invention has the advantages which have been described above with reference to the assembly of the liner and the support flange. The major advantage being that the contamination of wafers by particles that are released by contact between the liner and the support flange are prevented from entering the process chamber enclosed by the liner.

In an embodiment, the flange of the vertical furnace may include at least one gas inlet that opens in an area that is positioned radially inside the inner cylindrical surface of the liner wall. Gas that is needed for processing the wafers may be supplied to the process chamber via this at least one gas inlet. Thus an upward flow of gas may be created within the liner along the stack of wafers in the process chamber.

The various embodiments of the invention may be applied separate from each other or may be combined. Embodiments of the invention will be further elucidated in the detailed description with reference to some examples shown in the figures.

BRIEF DESCRIPTION OF THE FIGURES

FIG. 4 is a cross-section over the line IV-IV in FIG. 2;

FIG. 5 is a similar cross-section as shown in FIG. 4, but of an embodiment in which the support flange is provided with support pads;

FIG. 6 is a similar cross-section as shown in FIG. 4, but of an embodiment in which a support pad is provided on top of a part of the upper surface of the support flange;

FIG. 7 is a similar cross-section as shown in FIG. 4, but of an embodiment in which the upper surface of the flange is flat and the supporting surface of the support member is at a lower level than the lower end surface of the liner wall.

DETAILED DESCRIPTION OF THE FIGURES

In this application similar or corresponding features are denoted by similar or corresponding reference signs. The description of the various embodiments is not limited to the examples shown in the figures and the reference number used in the detailed description and the claims are not intended to limit what is described to the examples shown in the figures.

Figure 1:
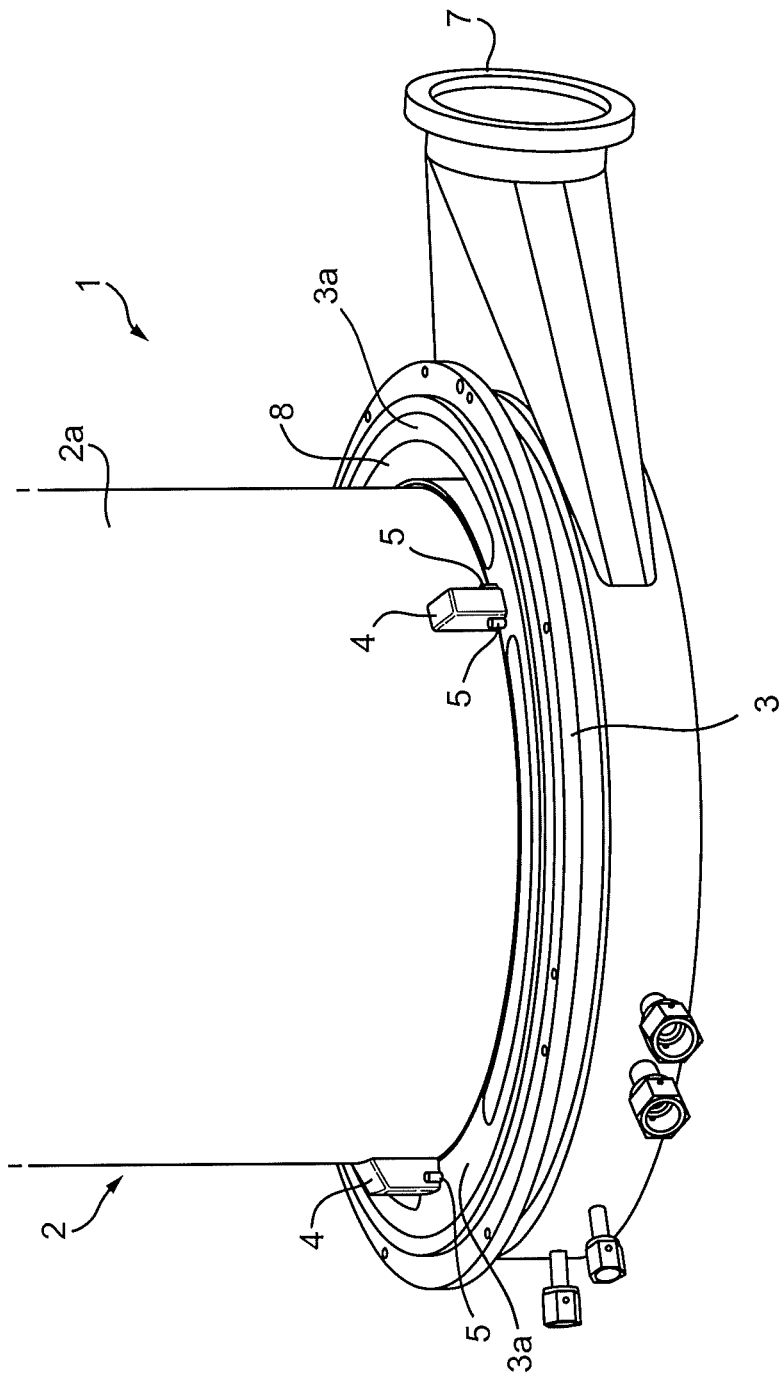
FIG. 1 is a perspective view of an assembly of a liner and a support flange.

FIG. 1 is a perspective view of an example of an assembly of a liner and a support flange in which various embodiments of the invention are realized. In the example shown in FIG. 1, the assembly 1 comprises a liner 2 comprising a cylindrical liner wall having an outer cylindrical surface 2a and an inner cylindrical surface 2b (see FIG. 2). The assembly 1 also includes a support flange 3 having an upper surface 3a. The liner 2 is supported by support members 4 that may be connected to the outer cylindrical surface of the liner wall 2a and each have a downwardly directed supporting surface. The supporting surfaces of the support members 4 are positioned radially outwardly from the inner cylindrical surface 2b (shown in FIG. 2). In this example, the supporting surfaces of the supporting members 4 are also positioned radially outwardly from the outer cylindrical surface 2a of the liner 2 to which they are attached. The downwardly directed supporting surface of the support members 4 are in contact with the upper surface 3a of the support flange 3 and support the liner 2. The support members 4 and the support flange 3 are configured such that the lower end surface 2c of the liner 2 is vertically spaced apart from the upper surface 3a of the support flange 3 (see FIGS. 3 and 7). The support flange 3 may be provided with positioning projections 5 that extend upwards from the upper surface 3a of the support flange 3. The positioning projections 5 may engage the support members 4 on a tangential end surface thereof. As a result, the positioning projections 5 have a centering function for the liner 2 relative to the support flange 3. The positioning projections 5 are spatially separated from the outer cylindrical surface 2a of the liner 2 (as also shown in FIG. 4), allowing the liner 2 to radially expand.

The support flange 3 may include gas exhausts 8 that are provided in the upper surface 3a of the support flange 3 radially outside of the liner 2. The gas exhausts 8 may be in fluid connection with a pump via channel 7 for withdrawing gas from the space surrounding the liner 2. Any particles, which may be created by friction between the support members 4 and the upper surface part 3a of the support flange 3 may be drained along with the gas through the gas exhausts 8. In any case, the released particles will not be able to enter the process chamber bounded by the inner cylindrical surface 2b of the liner 2.

Figure 2:
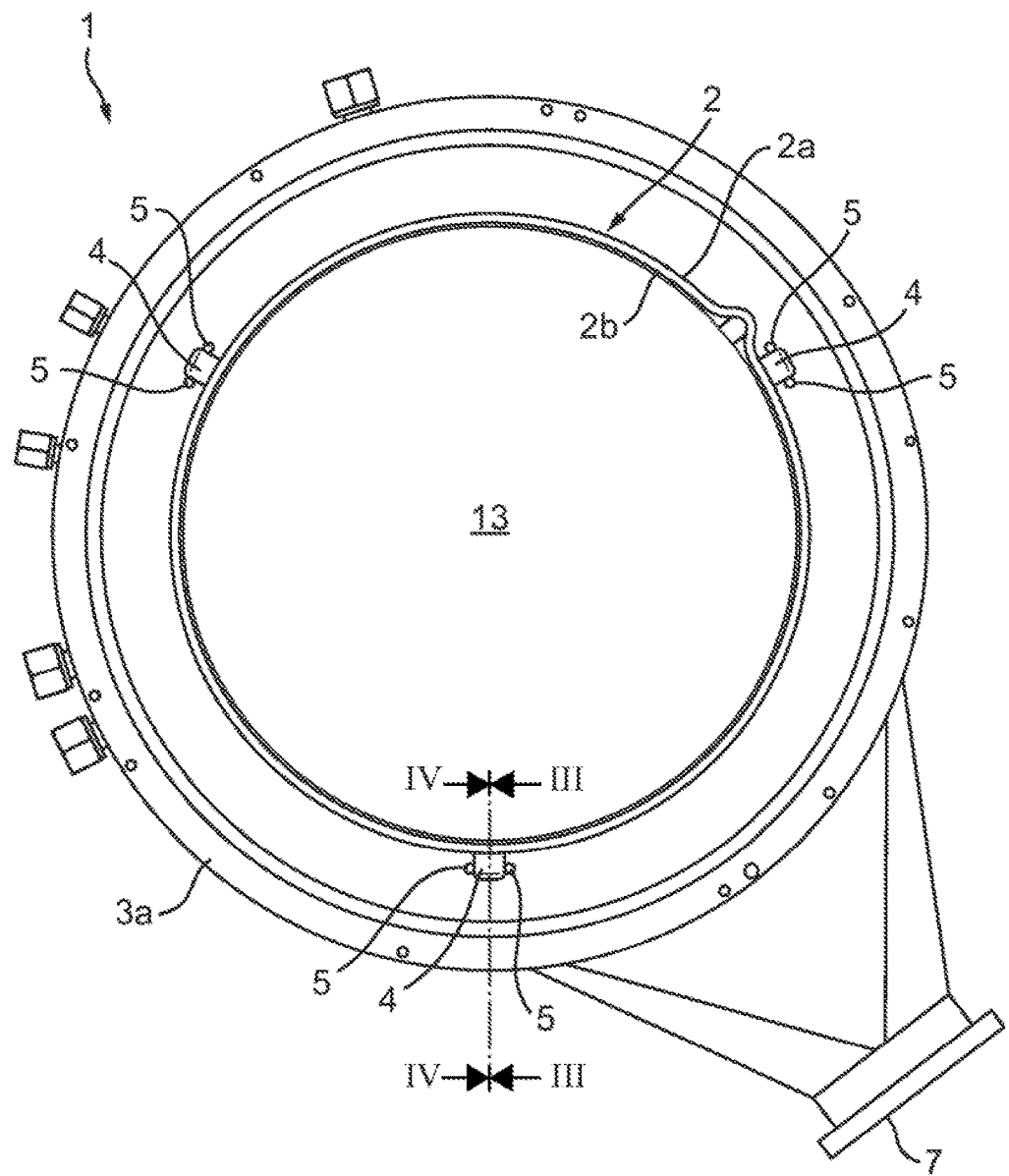
FIG. 2 is a schematic top view of the assembly of FIG. 1.

FIG. 2 is a schematic top view of the assembly of FIG. 1. The figure shows the liner 2 with the cylindrical wall defining an inner cylindrical surface 2b and an outer cylindrical surface 2a that, together with the lower end surface 2c of the cylindrical liner wall form an inlet 13 for inserting a boat configured to carry wafers. The support flange 3 also includes a central inlet opening for inserting and removing a boat with wafers. Also visible are the support members 4. In this example, the liner 2 has three support members 4 that are equally spaced along the circumference of the outer cylindrical surface 2a of the liner 2. The support members 4 may be embodied as protrusions that are connected to the outer cylindrical surface 2a of the cylindrical wall of the liner 2. The liner 2 and the protrusions forming the support members 4 may be manufactured from quartz and the protrusions may be welded to the outer cylindrical surface 2a. Instead of three support members 4, alternative embodiments may include two support members 4 or more than three support members 4. Furthermore, the support members 4 are spaced radially outwardly from the inner cylindrical surface 2b and, preferably, also radially outwardly from the outer cylindrical surface 2a of the liner 2. Also clearly illustrated is the space between the outer cylindrical surface 2a of the liner 2 and the positioning projections 5 so that radial expansion of the cylindrical liner wall 2 is possible. The tangential length of the supporting members 4 may typically be in the range of 1-5 cm.

Figure 3:
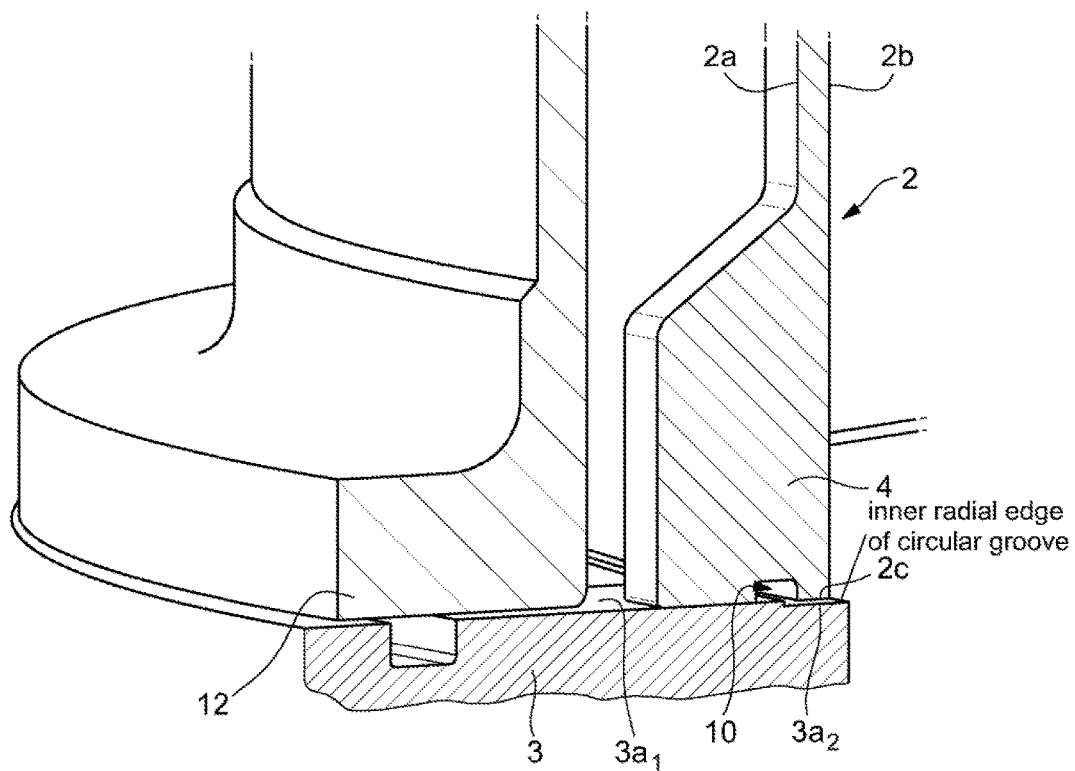
FIG. 3 is a cross-sectional perspective side of the assembly over the line III-III from FIG. 2 in which also the process tube of the vertical process furnace is shown.

FIG. 3 is a partial perspective cross-sectional view over the line III-III in FIG. 2 in which also a process tube 12 of a vertical process furnace is shown. FIG. 3 shows the liner 2 with a support member 4, which is attached to the outer cylindrical surface 2a of the liner 2. Clearly visible is that the support member 4 is positioned radially outwardly with regard to the cylindrical wall of the liner 2. The downwardly directed supporting surface of the support member 4 is in contact with the upper surface 3a of the support flange 3 and supports the liner 2. Also visible is that the support flange 3 has a first upper surface part $3a_1$, which extends under the support member 4 and a second upper surface part $3a_2$, extending under the lower end surface 2c of the cylindrical wall of the liner 2. In this example the second upper surface part $3a_2$ is formed as a circular groove, with an inner diameter smaller than the inner diameter of the liner 2. The outer diameter of the groove that forms the second upper surface part $3a_2$ has an outer diameter that is larger than the outer diameter of the liner 2. The support member 4 supports the liner 2 on the first upper surface part $3a_1$ so that the lower end surface 2c of the liner 2 is spaced apart from the second upper surface part $3a_2$ of the support flange 3. Thus a split is formed between the lower end surface 2c of the liner 2 and the second upper surface part $3a_2$ of the support flange 3. By virtue of this split, there is no contact between the liner 2 and the upper surface of the support flange 3 adjacent the inner cylindrical surface 2b of the liner wall 2.

The support member 4 additionally may include a recess 10 that extends along the tangential length of the support member 4 and has a downwardly directed side that is open. In this example, the radially inward recess edge 10a is located radially outwardly relative to the inner cylindrical surface 2b of the liner 2. The radially outward recess edge 10b of the recess 10 is positioned radially inward with regard to the supporting surface of the support member 4. As a result, the recess 10 is positioned at least partially across the circular groove $3a_2$ in the support flange 3; the radially inward recess edge 10a is located radially inward of groove $3a_2$ outer diameter and the radially outward recess edge 10b is located radially outward of groove $3a_2$ outer diameter. This configuration allows a flow of reaction gas to flow from the space delimited by the inner cylindrical surface 2b to the space delimited by the outside of the outer cylindrical surface 2a of the liner 2 and a support tube 12 (which is illustrated in FIG. 3).

Any particles that may be created by the friction between the downwardly directed surface of the support member 4 and the upper surface $3a_1$ of the support flange 3 that is opposite the support member 4, will be transported away from the split between the lower end surface 2c and the upper surface 3a of the flange by the radial outward flow of gas in that split. The particles will be carried by the gas flow to the space delimited by the outer cylindrical surface 2a of the liner 2 and the process tube 12 of the vertical process furnace. The gas including the particles may subsequently be removed through the gas exhausts 8 and subsequently exhaust channel 7 towards a pump. If particles are created at a radially inner part of the supporting surface of the supporting member 4 and would be released in the recess 10, then the radial outward flow of the gas in the split between the lower end surface 2c of the liner 2 will prevent the entrance of the particles within the space bounded by the liner. FIG. 5 is similar a cross-section over the line IV-IV in FIG. 2 of a different embodiment in which the support flange 3 is provided with a support pad 11. FIG. 5 depicts the liner 2, support member 4 and the support flange 3. The support flange 3 is in this example provided with a support pad 11 that is embedded in the support flange 3. The support pad 11 is in contact with the downwardly directed supporting surface of the support member 4 and is configured to reduce the friction between the support flange 3 and the supporting surface of the support member 4. In order to provide the said reduction of friction, the support pad 11 may be made of a material with a relatively low constant of friction, such as for example Teflon, Polyimide, PEEK, Hastelloy or any other suitable material. In addition, the support pad 11 could also be made of a metal having a coating of a material with a relatively low constant of friction, such as for example Teflon, Polyimide, PEEK, Hastelloy, other polymeric coatings or a coating of a diamond-like carbon.

FIG. 6 is a similar cross-section over the line IV-IV in FIG. 2 of a different embodiment in which the support pad 11 is provided on top of a part of the upper surface 3a of the support flange 3. The support pad 11 can be provided on the support flange 3 such that the support pad 11 forms the first upper surface part $3a_1$. This could for example be done by applying a layer or coating with a relatively low constant of friction on a part of the upper surface 3a of the flange 3 that is opposite the supporting members 4. As a result, the upper surface 3a of the support flange needs not be provided with a groove, which is advantageous in view of manufacturing costs. Also visible is the recess 10 that extends along the tangential length of the support member 4 and has a downwardly directed side that is open so that any particles that are released at the contact between the supporting surface of the support member 4 and the upper surface part $3a_1$ of the supporting flange 3 may be transported via recess 10 away to the gas exhausts 8.

FIG. 7 is a similar cross-section over the line IV-IV in FIG. 2 of yet another embodiment. In this embodiment of the assembly 1, the downwardly facing supporting surfaces of the support members 4 are positioned at a lower level than the lower end surface 2c of the cylindrical liner wall 2, thus elevating the lower end surface 2c of the liner 2 just above the upper surface 3a of the support flange 3 and thus creating a split between the upper surface 3a of the support flange 3 and the lower end surface 2c of the liner cylindrical wall 2.

Figure 8:
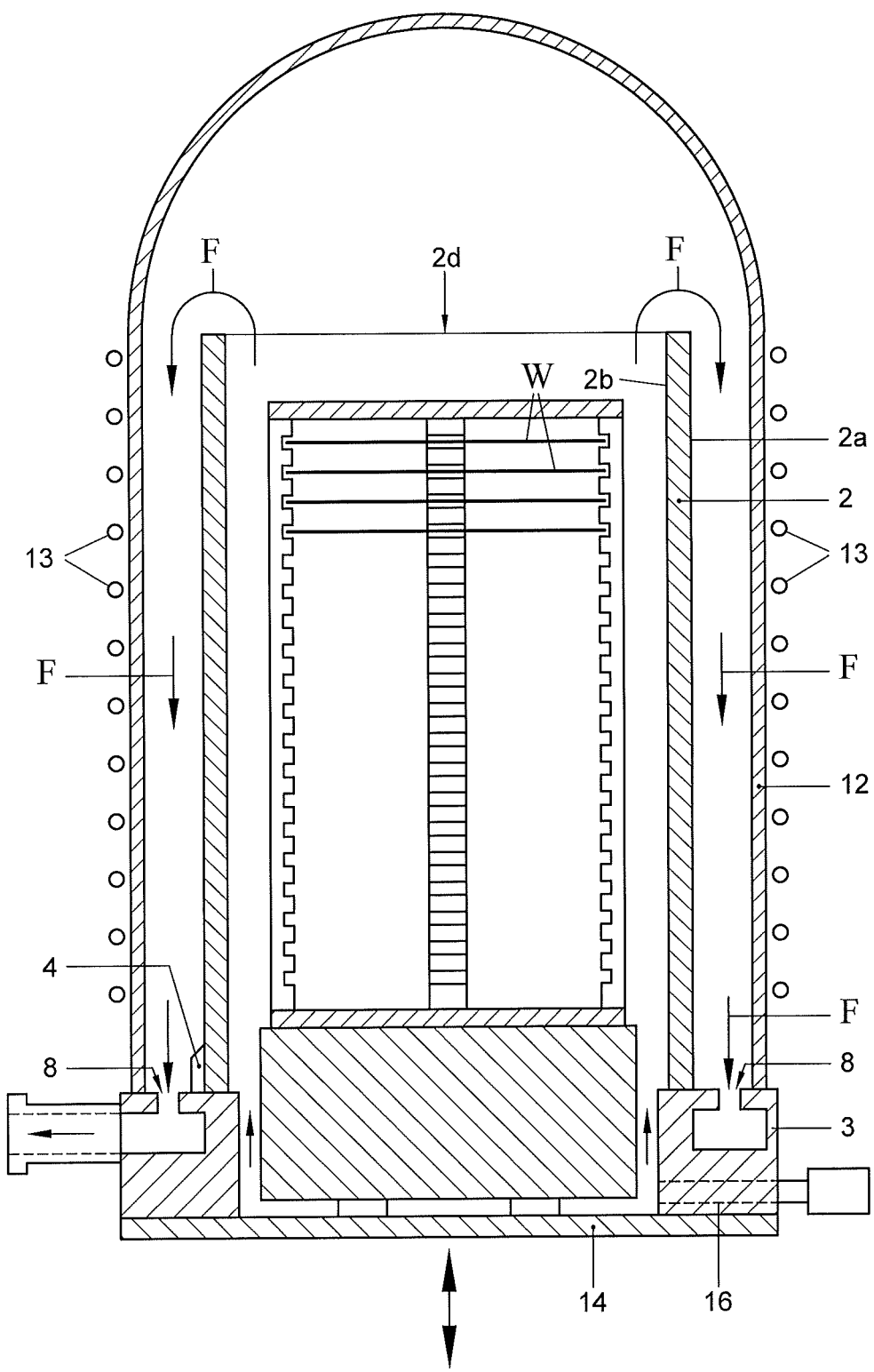
FIG. 8 shows a cross-sectional view of a vertical process furnace including an assembly of a liner and a support flange.

FIG. 8 shows an example of a vertical process furnace including an assembly of a liner and a support flange as described above. The vertical process furnace includes a process tube 12 defining an interior process tube space; heating means 13 configured to heat the interior process tube space; and a vertically movably arranged door 14 configured to close off the central inlet opening in the support flange 3 and configured to support a wafer boat 15 that is configured to hold semiconductor wafers W. The novel feature of the vertical process surface is formed by an assembly of a liner and a support flange according to the invention of which various embodiments are described above. The support flange 3 is connected to a bottom side of the process tube 12 and the liner 2 extends in the interior process tube space.

In an embodiment the flange 3 may include at least one gas inlet 16 that opens in the process chamber radially inside the inner cylindrical surface 2b of the liner wall 2.

In this embodiment gas may be supplied into the process chamber that is bounded by the inner cylindrical surface 2b of the liner 2. The gas, indicated with arrows F, may flow upwardly through the process chamber towards a gas outlet 2d of the liner 2 which is at or near the top of the liner 2. Subsequently, the gas will flow downwardly in the space between the process tube 12 and the outer cylindrical surface 2a of the liner 2 towards the gas exhausts 8 in the support flange 3.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another.

The invention claimed is:

1. An assembly of a liner and a support flange for a vertical furnace for processing wafers, the assembly comprising:

the support flange including a central inlet opening for inserting and removing a boat that is configured to carry wafers, wherein the support flange is configured to support the liner of the assembly;

the liner including:
a cylindrical wall extending along an axial direction defining an inner cylindrical surface bounding an inner space, an outer cylindrical surface and a lower end surface that delimits a liner inlet opening for inserting and removing a boat that is configured to carry wafers;
a gas outlet opening adjacent an upper end of the liner; and
at least two support members that are connected to the cylindrical wall, each having a downwardly directed supporting surface, wherein each downwardly directed supporting surface is positioned radially outwardly from the inner cylindrical surface, wherein the support members support the liner in that a weight of the liner is transferred via the support members to the support flange;

wherein the assembly further comprises:
at least one gas inlet opening for supplying gas in the inner space of the cylindrical wall at a lower end of the inner space; and
at least one gas exhaust for exhausting gas from an exhaust space surrounding the cylindrical wall at a lower end of the cylindrical wall, wherein the support flange and/or the liner are configured such that, when the liner is placed on the support flange, the downwardly directed supporting surfaces of the at least two support members rest on an upper surface of the support flange thereby carrying the liner, wherein at least a part of the lower end surface of the cylindrical wall of the liner that bounds the inner cylindrical surface is spaced vertically apart from an upper surface part of the support flange that is directly opposite said part of the lower end surface of the cylindrical wall to create a circumferentially extending circular slit between said part of the lower end surface of the cylindrical wall of the liner and the upper surface part of the support flange that is directly opposite said part of the lower end surface of the cylindrical wall of the liner, wherein the circumferentially extending circular slit fluidly connects the inner space with the exhaust space surrounding the cylindrical wall at the lower end of the cylindrical wall;

wherein, in use, a gas pressure within the inner space bounded by the cylindrical wall of the liner is higher than a gas pressure prevailing in the exhaust space radially outside the outer cylindrical surface of the cylindrical wall at the at least one gas exhaust so that a main flow of gas will enter the inner space at the lower part thereof via the at least one gas inlet, flow upwardly within said inner space and leave the inner space via the gas outlet opening adjacent an upper end of the liner and subsequently flow downwardly along the space surrounding the cylindrical wall towards the at least one gas exhaust, and wherein a secondary flow of gas will flow through the circumferentially extending slit from the inner space bounded by the cylindrical wall of the liner towards the space surrounding the outer cylindrical wall of the liner.

2. The assembly of claim 1, wherein the lower end surface of the cylindrical wall is axially spaced from the downwardly directed supporting surfaces of the at least two support members of the liner, wherein the downwardly directed supporting surfaces of the support members of the liner are positioned at a lower level than the lower end surface of the cylindrical wall.

3. The assembly according to claim 1, wherein the support flange includes a first, horizontal surface part that is opposite the at least two support members and a second, horizontal surface part that extends at least opposite the lower end surface of the cylindrical wall, wherein the second, horizontal surface part is at a lower level than the first, horizontal surface part.

4. The assembly according to claim 3, wherein the second, horizontal surface part is a circular groove in the upper surface of the support flange that forms the first, horizontal surface part, wherein the circular groove has a center that coincides with a central vertical axis of the liner and wherein an inner radial edge of the circular groove has a diameter that is smaller than an inner diameter of the cylindrical wall of the liner and wherein an outer radial edge of the circular groove has a diameter that is larger than an outer diameter of the cylindrical wall of the liner.

5. The assembly according to claim 1, wherein the support flange includes a main part and at least one support pad that is connected to the main part and is located opposite the at least two support members, wherein the at least one support pad has a coefficient of friction that is smaller than the coefficient of friction of the main part.

6. The assembly according to claim 5, wherein the at least one support pad is at least partially embedded in the main part of the support flange.

7. The assembly according to claim 5, wherein the support flange includes a first, horizontal surface part that is opposite the at least two support members and a second, horizontal surface part that extends at least opposite the lower end surface of the cylindrical wall, wherein the second, horizontal surface part is at a lower level than the first, horizontal surface part, wherein the first, horizontal surface part is formed by an upper surface of the at least one support pad.

8. The assembly according to claim 7, wherein the main part of the support flange comprises a flat upper surface to which the at least one support pad is connected, wherein the upper surface of the main part forms the second surface part.

9. The assembly according to claim 5, wherein the at least one support pad is made of a material chosen from the group consisting of: Teflon, Polyimide, PEEK, and Hastelloy.

10. The assembly according to claim 5, wherein the at least one support pad is made of a metal having a coating chosen from the group consisting of: Teflon, Polyimide, PEEK, a polymeric coating, and a coating of diamond-like carbon.

11. The assembly according to claim 1, wherein each support member has a tangential length and comprises at its downwardly directed surface a recess extending tangentially along the entire tangential length of each of the support members, the recess defining a radially inward recess edge and a radially outward recess edge and having a downwardly directed side that is open, the radially outward recess edge being positioned radially inwardly relative to the downwardly directed supporting surface and the radially inward recess edge is positioned radially outwardly relative to the cylindrical wall.

12. The assembly according to claim 1, wherein each support member is a protrusion that is connected to the outer cylindrical surface of the cylindrical wall of the liner, wherein the downwardly directed supporting surface formed by a downwardly directed surface of the protrusion is positioned radially outwardly from the outer cylindrical surface of the cylindrical wall of the liner.

13. The assembly according to claim 1, wherein the support members have tangential end surfaces, the tangential sides extending radially outwardly from the outer cylindrical surface of the cylindrical wall, wherein the support flange is provided with a plurality of positioning projections, wherein at least one positioning projection of the positioning projections extends upwards from the upper surface of the support flange, and wherein the positioning projections and the outer cylindrical surface of the liner are spatially separated, and wherein the positioning projections are parallel to at least one tangential end surface of the tangential end surfaces of at least one support member of the support members and engage a said tangential side of said support member, so that the liner is centered between the positioning projections and is allowed to radially expand.

14. The assembly according claim 1, wherein the liner comprises three support members, evenly spaced along the circumference of the outer cylindrical surface of the cylindrical wall of the liner.

15. The assembly according to claim 1, wherein each supporting member of the support members has a tangential length that is in the range of 1-5 cm.

16. A vertical process furnace, including:
a process tube defining an interior process tube space;
heating means configured to heat the interior process tube space;
an assembly according to claim 1, wherein the support flange is connected to a bottom side of the process tube and wherein the liner extends in the interior process tube space; and
a vertically movably arranged door configured to close off the central inlet opening in the support flange and configured to support a wafer boat that is configured to hold semiconductor wafers.

17. The vertical process furnace according to claim 16, wherein the support flange includes the at least one gas inlet.

* * * * *